(12) United States Patent
Kawaguchi et al.

(10) Patent No.: US 10,709,047 B2
(45) Date of Patent: Jul. 7, 2020

(54) COMPONENT MOUNTING DEVICE HEAD UNIT

(71) Applicant: FUJI CORPORATION, Chiryu-shi (JP)

(72) Inventors: Koji Kawaguchi, Kasugai (JP); Junichi Narita, Anjo (JP)

(73) Assignee: FUJI CORPORATION, Chiryu-shi (JP)

( * ) Notice: Subject to any disclaimer, the term of this patent is extended or adjusted under 35 U.S.C. 154(b) by 451 days.

(21) Appl. No.: 15/542,798

(22) PCT Filed: Jan. 19, 2015

(86) PCT No.: PCT/JP2015/051254
§ 371 (c)(1),
(2) Date: Jul. 11, 2017

(87) PCT Pub. No.: WO2016/117009
PCT Pub. Date: Jul. 28, 2016

(65) Prior Publication Data
US 2018/0006543 A1 Jan. 4, 2018

(51) Int. Cl.
*H05K 13/04* (2006.01)
*H02K 41/03* (2006.01)
*H05K 1/02* (2006.01)
*F28D 1/02* (2006.01)
*H01L 23/427* (2006.01)

(52) U.S. Cl.
CPC ....... *H05K 13/0406* (2018.08); *H02K 41/033* (2013.01); *H05K 1/0203* (2013.01); *F28D 1/024* (2013.01); *H01L 23/427* (2013.01)

(58) Field of Classification Search
CPC ............. H02K 41/033; H05K 13/0406; H05K 1/0203; F28D 1/024; H01L 23/427
See application file for complete search history.

(56) References Cited

U.S. PATENT DOCUMENTS

2002/0148109 A1 10/2002 Kashitani et al.
2014/0210336 A1 7/2014 Yamanaka et al.

FOREIGN PATENT DOCUMENTS

| DE | 10 2006 017 033 A1 | 10/2007 |
|---|---|---|
| EP | 1 246 520 A2 | 10/2002 |
| EP | 2 755 308 A1 | 7/2014 |
| JP | 2002-238238 A | 8/2002 |
| JP | 2005-79496 A | 3/2005 |

(Continued)

OTHER PUBLICATIONS

Extended European Search Report dated Dec. 19, 2017 in Patent Application No. 15878705.1, 8 pages.

(Continued)

*Primary Examiner* — Mohamad A Musleh
(74) *Attorney, Agent, or Firm* — Oblon, McClelland, Maier & Neustadt, L.L.P.

(57) ABSTRACT

A component mounting device head unit includes a head main body, a nozzle being provided on the head main body, a drive source, a cover, and a heat transfer member. The nozzle is configured to pick up a component. The drive source is configured to transfer moving power to at least one of the head main body and the nozzle. The cover covers the drive source. The heat transfer member connects the cover to the drive source or a frame of the drive source, and the heat transfer member is configured to allow heat generated by the drive source to escape to the cover.

4 Claims, 5 Drawing Sheets

(56) References Cited

FOREIGN PATENT DOCUMENTS

| | | |
|---|---|---|
| JP | 2006-180645 A | 7/2006 |
| JP | 2009-171665 A | 7/2009 |
| JP | 2009-218278 A | 9/2009 |
| JP | 2010-45143 A | 2/2010 |
| JP | 2010/172071 A | 8/2010 |
| JP | 2012-44128 A | 3/2012 |
| JP | 2014-160733 A | 9/2014 |
| WO | WO 2010/036204 A1 | 4/2010 |

OTHER PUBLICATIONS

International Search Report dated Feb. 10, 2015, in PCT/JP2015/051254 filed Jan. 19, 2015.

COMPONENT MOUNTING DEVICE HEAD UNIT

TECHNICAL FIELD

The present application relates to a head unit used on a component mounting device.

BACKGROUND ART

Conventionally, there are known component mounting devices provided with a head unit. A head unit is provided with items such as a head main body, a nozzle provided on the head main body, a motor that transfers moving power to the nozzle to move the nozzle in a vertical direction, and a side-view camera that images a component held by the nozzle from the side. For example, with the component mounting device disclosed in patent literature 1, a linear motor is used as the motor that moves the nozzle in the vertical direction.

CITATION LIST

Patent Literature

Patent literature 1: JP-A-2009-171665

SUMMARY

For such a component mounting device, there are cases in which the motor and side-view camera are covered by a large cover for protection.

However, there is a problem in that heat generated by driving of the motor gets trapped inside a portion covered by the cover. This problem especially applies to linear motors because they generate a large amount of heat.

The present disclosure solves the above problem and an object thereof is to efficiently release heat from an inside portion covered by a cover in a head unit used on a component mounting device.

A component mounting device head unit of the present disclosure includes: a head main body;
a nozzle configured to pick up a component, the nozzle being provided on the head main body,
a drive source configured to transfer moving power to at least one of the head main body and the nozzle;
a cover covering the drive source; and
a heat transfer member connecting the cover to the drive source or a frame of the drive source, the heat transfer member being configured to allow heat generated by the drive source to escape to the cover.

With this component mounting device head unit, heat generated by the drive source escapes via a heat transfer member to a cover with a relatively large surface area. By this, heat inside the cover is released efficiently.

In a component mounting device head unit of the present disclosure, the drive source may be a linear motor configured to transfer moving power to the nozzle so as to move the nozzle in a vertical direction. The present disclosure is highly applicable in this case because a linear motor generates a relatively large amount of heat.

In a component mounting device head unit of the present disclosure, the cover may include multiple openings. Because this allows air to flow between the inside covered by the cover and the outside via the openings as the head unit moves, heat inside the cover is released even more efficiently. Note that, the cover may be provided with grooves instead of multiple openings or with both. In this case, it is desirable that the grooves are formed along a direction in which the head unit moves.

In a component mounting device head unit of the present disclosure, the head transfer member may be multiple metal rod members or multiple heat pipes. Because this improves the thermal conductivity of the heat transfer member, heat inside the cover is released even more efficiently. As a metal for the metal rod members, for example, gold, silver, copper, or aluminum may be used, but considering factors such as cost and weight, aluminum is desirable. A heat pipe is an item in which a small amount of liquid is vacuum sealed inside a pipe that has a capillary structure known as a wick on an interior wall.

A component mounting device head unit of the present disclosure may further include: a camera configured to image a component held by the nozzle, the camera being provided at a location covered by the cover, wherein the heat transfer member connects a surface of the cover except for a surface facing the camera to the drive source or the frame of the drive source. Because this makes the surface of the cover that faces the camera less likely to become hot, the camera, which is relatively easily influenced by heat, is protected from heat.

DESCRIPTION OF EMBODIMENTS

Figure 1:
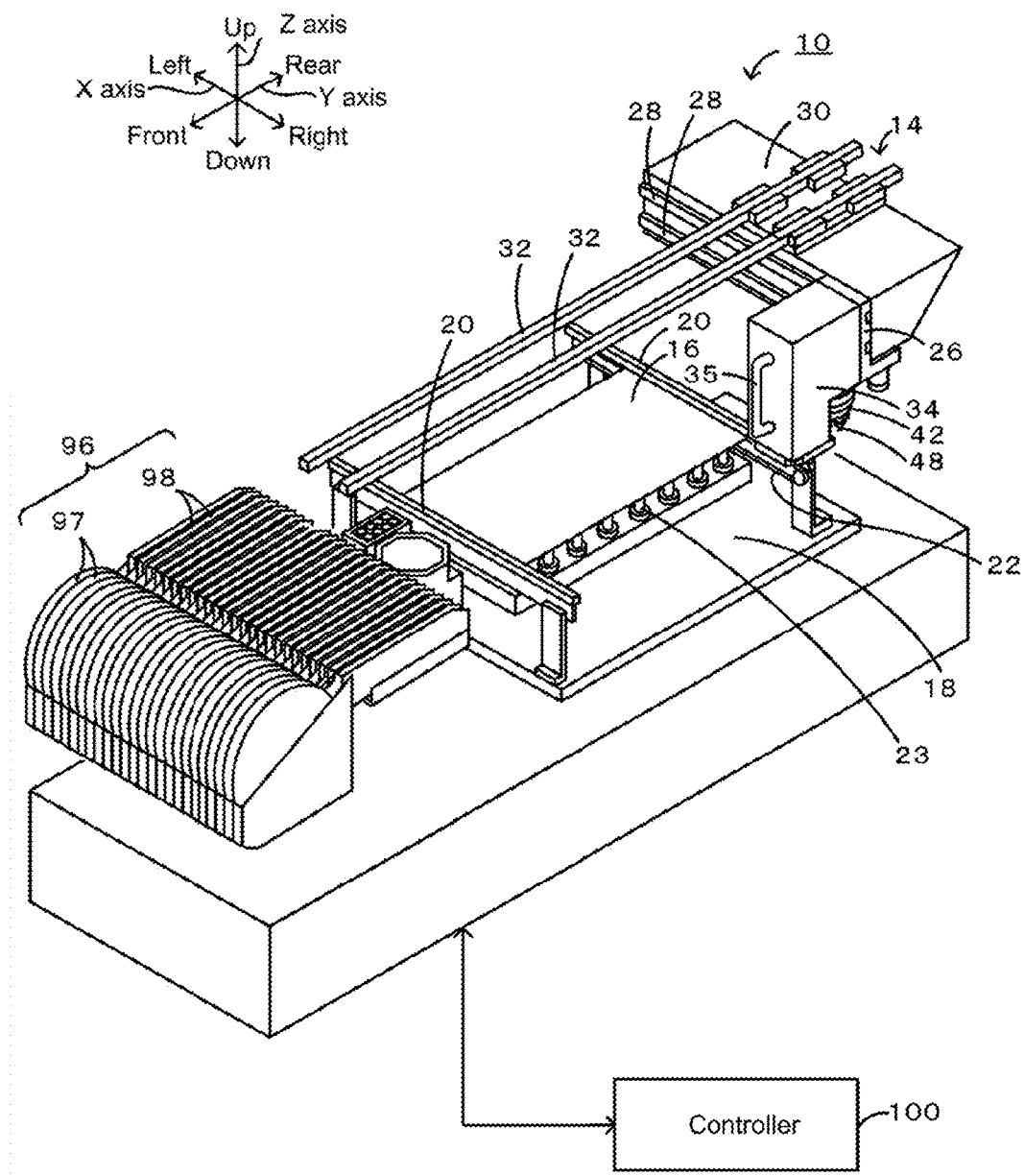
FIG. 1 is a perspective view of component mounting device 10.
Figure 2:
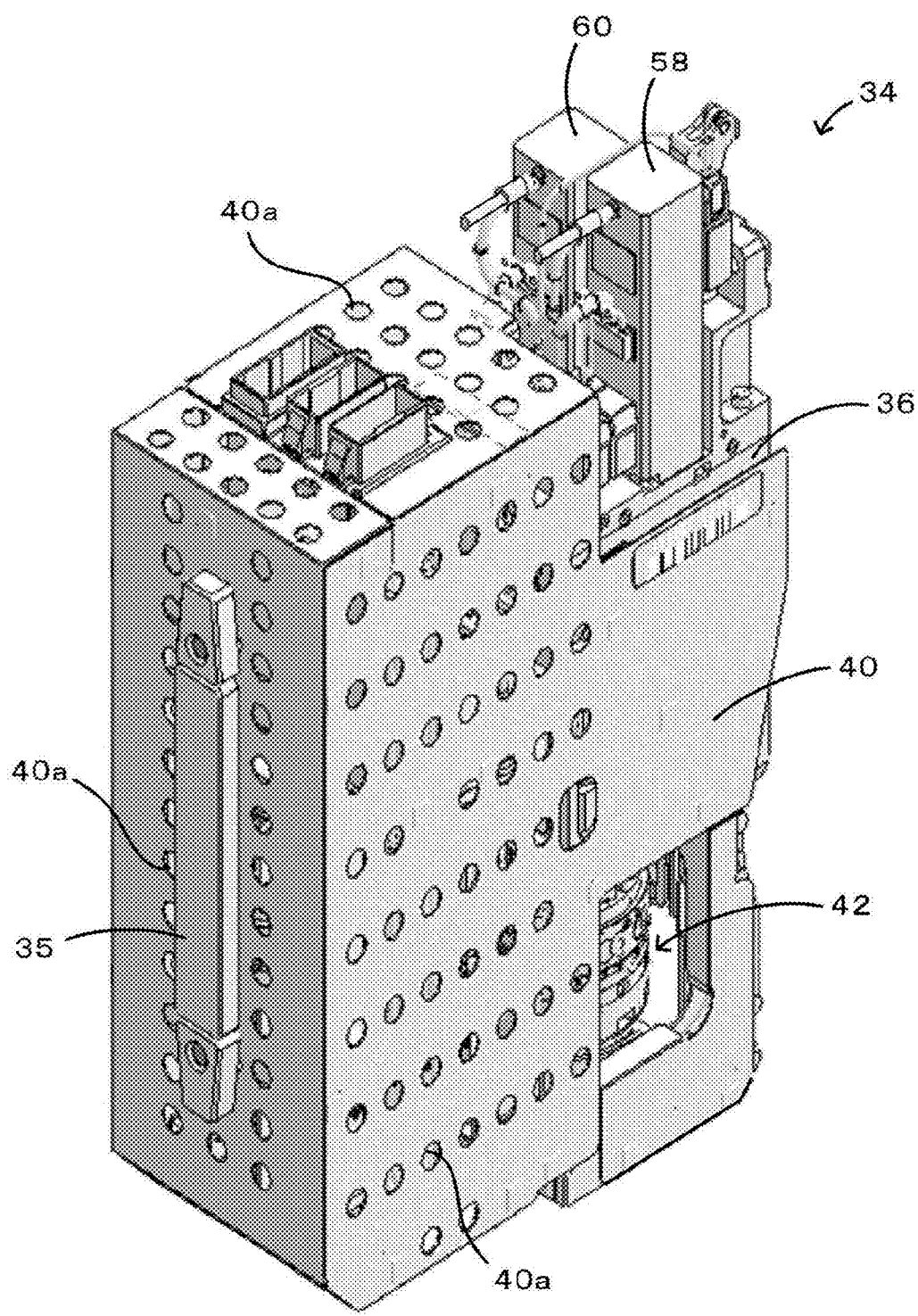
FIG. 2 is a perspective view of head unit 34.
Figure 3:
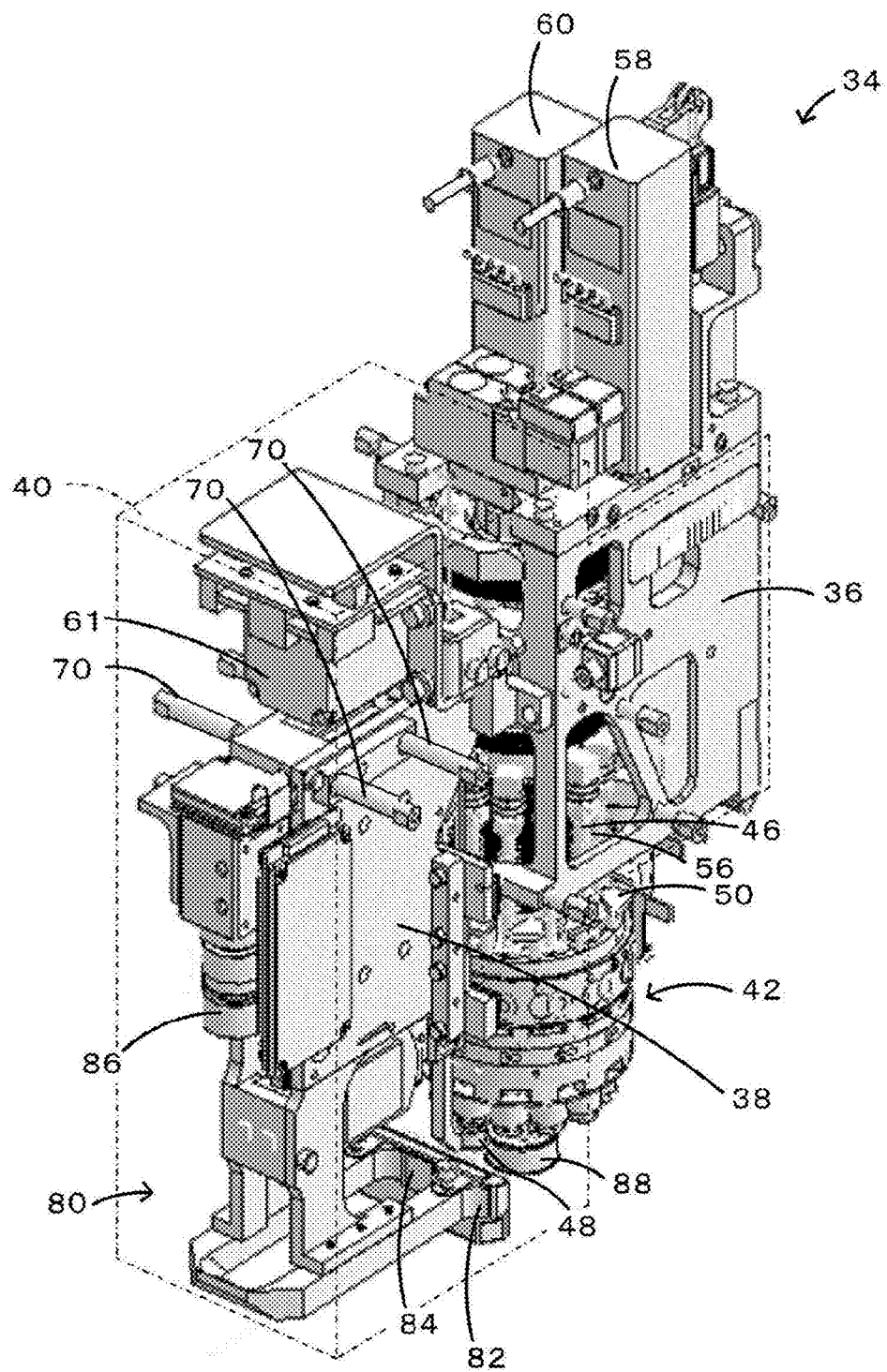
FIG. 3 is a perspective view of head unit 34 with outer cover 40 removed.
Figure 4:
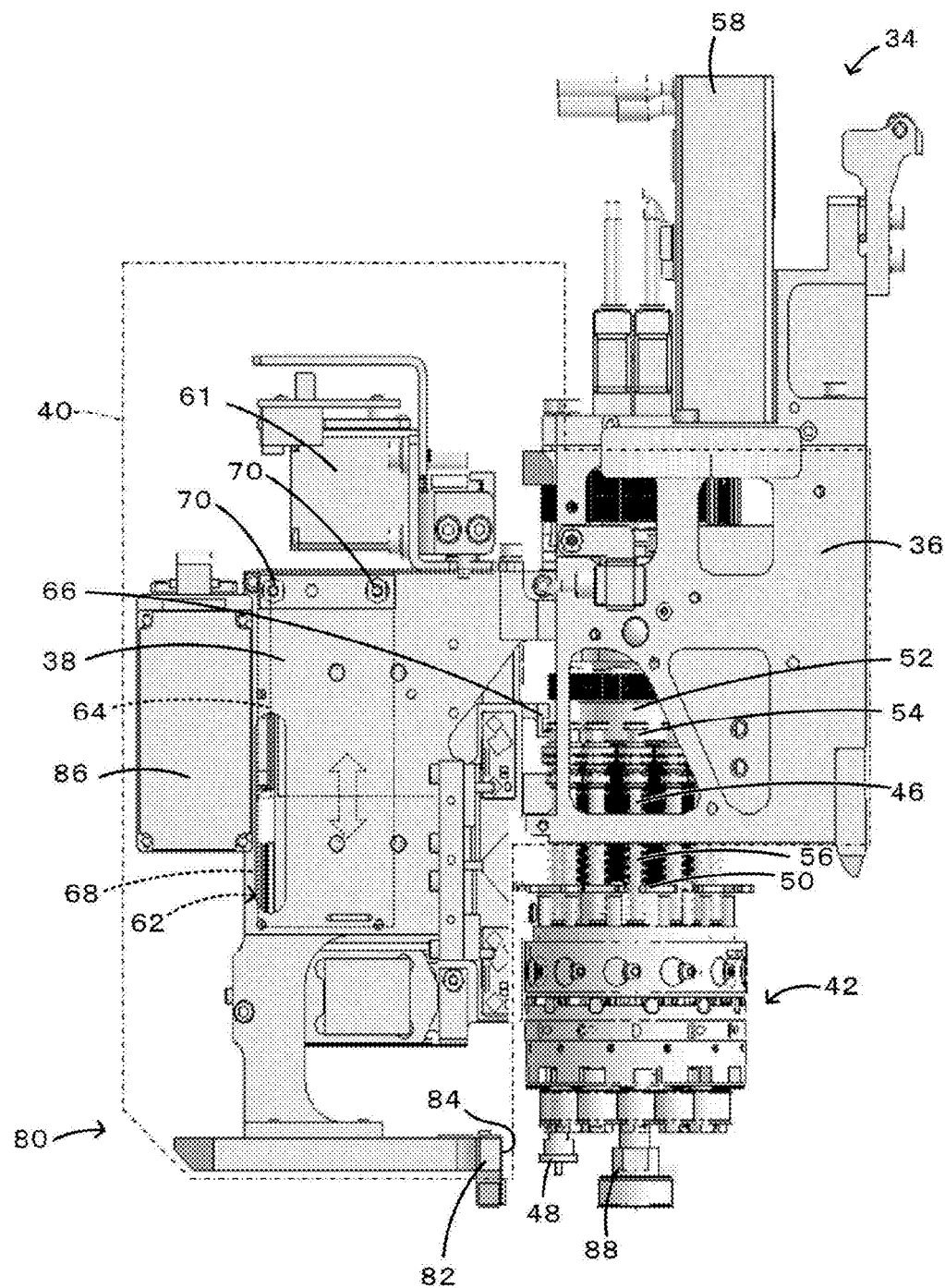
FIG. 4 is a right side view of head unit 34 with outer cover 40 removed.

Hereinafter, an embodiment of the present disclosure will be described with reference to the figures. FIG. 1 is a perspective view of component mounting device 10, FIG. 2 is a perspective view of head unit 34, FIG. 3 is a perspective view of head unit 34 with outer cover 40 removed, and FIG. 4 is a right side view of the same. In the present embodiment, left-right directions (X axis), front-rear directions (Y axis), and up-down directions (Z axis) are set as shown in FIG. 1. Also, in FIG. 2, handle 35 comes out when pulled.

As shown in FIG. 1, component mounting device 10 is provided with mounting device main body 14, reel unit 96, and controller 100.

Mounting device main body 14 is provided with board conveyance device 18 that conveys board 16, and head unit 34 capable of movement in an XY plane.

Board conveyance device 18 is provided with support plates 20 and 20 arranged with a gap between them in the front-rear direction of FIG. 1 and extending in the left-right direction, and conveyor belts 22 and 22 (only one of which is shown in FIG. 1) provided on surfaces of both supporting plates 20 and 20 that face each other. Conveyor belts 22 and 22 are endlessly supported on drive wheels and driven wheels provided on the left and right of support plates 20 and 20. Board 16 is loaded on the upper surface of the pair of conveyor belts 22 and 22 and conveyed from left to right. Board 16 is supported from the underside by many support pins 23.

Head unit 34 is detachably attached to a front surface of X-axis slider 26. Head unit 34 includes handle 35 on a front surface, the handle being held by an operator during exchange work. X-axis slider 26 is slidably attached to a pair of lower and upper guide rails 28 and 28 that are attached to a front surface of Y-axis slider 30 and that extend in the left-right direction. Y-axis slider 30 is slidably attached to a pair of guide rails 32 and 32 that extend in the front-rear direction. Head unit 34 moves in the left and right directions based on the moving in the left and right directions of X-axis slider 26, and moves in the front and rear directions based on the moving in the front and rear directions of Y-axis slider 30. Note that, each slider 26 and 30 is driven by a drive motor (not shown).

Reel unit 96 is provided with multiple reels 97, and is detachably attached to a front side of mounting device main body 14. Tape is wound around each reel 97 and components are held in the surface of the tape in a lengthwise direction. The components are protected by a film that covers the surface of the tape. The tape is unwound from the reel towards the rear, and at feeder section 98 is fed to a pickup position at which pickup is performed by suction nozzle 48 in a state with a component exposed due to the film being peeled.

Controller 100 is configured from a microprocessor based around a CPU, and is provided with ROM that memorizes a processing program, RAM used as working memory, an HDD that memorizes various data, and so on. Controller 100 outputs a drive signal to board conveyance 18, a drive motor of X-axis slider 26, a drive motor of Y-axis slider 30, and various motors provided on head unit 34, and receives an image signal from side-view camera 80 provided on head unit 34. Also, controller 100 is connected to reel unit 96 such that two-way communication is possible.

Figure 5:
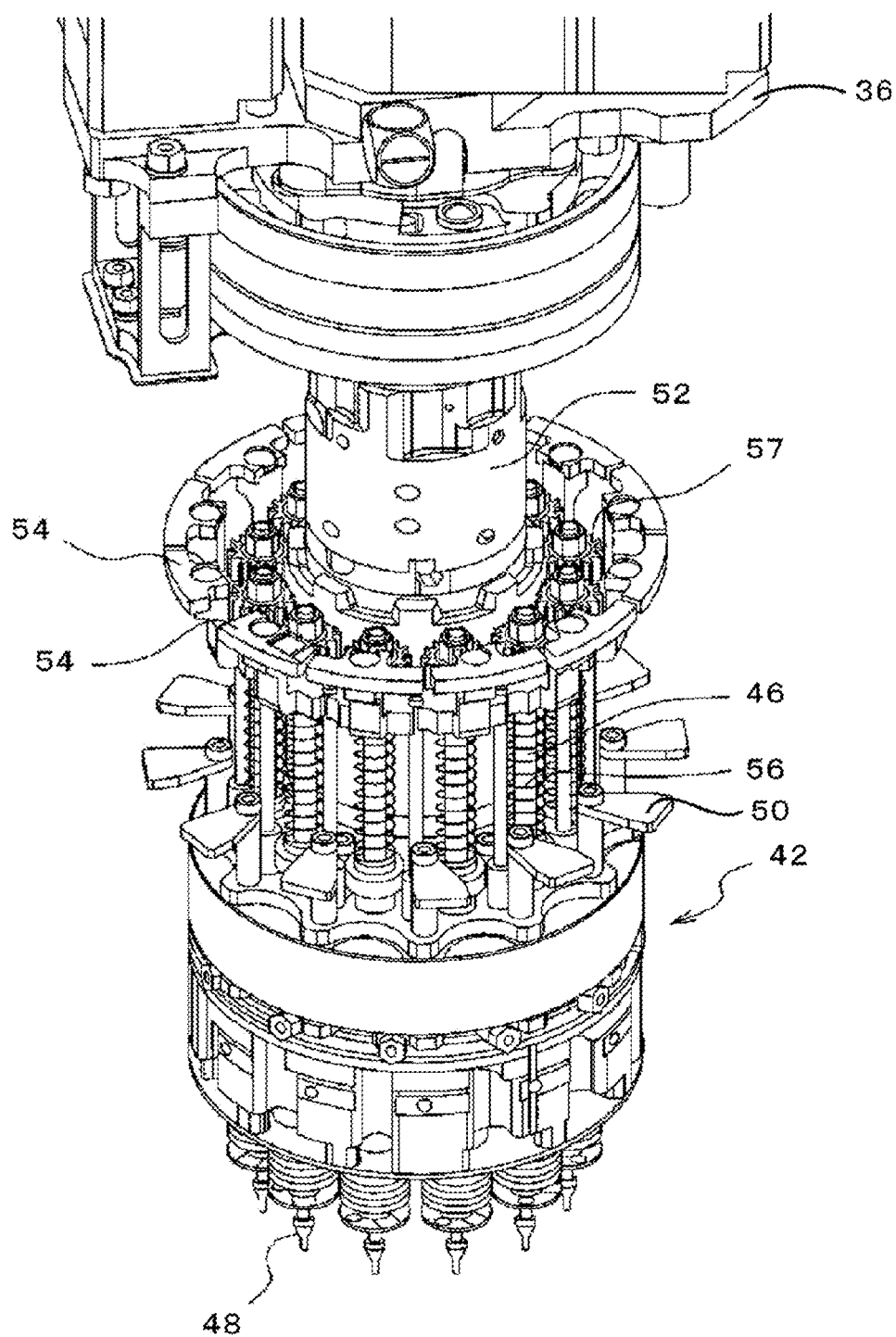
FIG. 5 is a perspective view of rotary head 42 that is attached to main frame 36.

Next, details of head unit 34 are described with reference to FIGS. 2 to 5. FIG. 2 is a perspective view of head unit 34, FIGS. 3 and 4 are a perspective view and a right side view of head unit 34 with outer cover 40 removed, and FIG. 5 is a perspective view of rotary head 42 that is attached to main frame 36.

Head unit 34 is provided with main frame 36, sub frame 38, outer cover 40, rotary head 42, linear motor actuator 62, and side-view camera 80.

Main frame 36 is freely attachable and detachable to and from X-axis slider 26 (refer to FIG. 1) and is provided with items such as R-axis motor 58 and e-axis motor 60 in addition to rotary head 42.

As shown in FIGS. 3 and 4, sub frame 38 is fixed to a front side of main frame 36, and is provided with items such as linear motor actuator 62, side-view camera 80, and stepping motor 61. Note that, sub frame 38 is arranged to sandwich linear motor actuator 62 shown in FIG. 4 from the left side and the right side. Therefore, sub frame 38 can be thought of as a frame of linear motor actuator 62.

As shown in FIG. 2, outer cover 40 covers the front surface, left and right surfaces, and upper surface of main frame 36, and has multiple openings 40a provided in each of its surfaces. Main frame 36, sub frame 38, and outer frame 40 are made from a material that is relatively light with good thermal conductivity, for example, aluminum or aluminum alloy.

Rotary head 42 is a cylindrical member and, as shown in FIGS. 3 to 5, is provided with nozzle holders 46, suction nozzles 48, and valve levers 50. As shown in FIG. 5, rotary head 42 is able to be engaged and disengaged with R-shaft 52 that extends in a vertical direction and is a cylindrical member rotatably attached to main frame 36, an engaged state being achieved by R-axis 52 being inserted into rotary head 42. R-axis 52 is connected to R-axis motor 58 via a gear mechanism, not shown, so as to rotate with rotation of R-axis motor 58. In a state engaged with R-axis 52, rotary head 42 rotates as one with R-axis 52 with rotation of R-axis motor 58. Multiple (twelve in this case) nozzle holders 46 are provided on an outer circumference of rotary head 42 to be slidable in a vertical direction. Nozzle holder 46 has nozzle operation lever 54 near an upper end of the nozzle holder, and is positioned at a specified position (upper position) by being biased upwards by spring 56. When nozzle operation lever 54 is lowered, nozzle holder 46 and suction nozzle 48 are lowered against the elastic force of spring 56, and when nozzle operation lever 54 is released, nozzle holder 46 and suction nozzle 48 are returned to the upper position by the elastic force of spring 56. Small gear 57 is provided around an outer circumference of an upper section of nozzle holder 46. Each small gear 57 is connected to θ-axis motor 60 via a gear mechanism, not shown, so as to rotate with rotation of θ-axis motor 60. Suction nozzle 48 is detachably attached to a lower end of nozzle holder 46. For ease of understanding, in FIGS. 3 and 4, only one suction nozzle 48 is shown attached to one nozzle holder 46, but in actuality, as shown in FIG. 5, a suction nozzle 48 is attached to each of the nozzle holders 46. Suction nozzles 48 are exchanged as appropriate based on factors such as the type and size of component. Also, suction nozzle 48 rotates as one with nozzle holder 46 provided with small gear 57 with rotation of θ-axis motor 60. Valve lever 50 is provided for each suction nozzle 48. Valve lever 50 is used to switch to and from supplying vacuum and atmospheric pressure to the nozzle tip. Valve lever 50 is operated by stepping motor 61.

As shown in FIG. 4, linear motor actuator 62 is provided with slider 64 and linear guide 68. Slider 64 has an in-built coil that is an electromagnet, and also has lever engaging section 66. Lever engaging section 66 has a C-shaped cross section, and engages with nozzle operation lever 54 by sandwiching nozzle operation lever 54 from above and below. Multiple nozzle operation levers 54 are arranged at positions to be engagable in succession with lever engaging sections 66 as rotary head 42 is rotated each time by a specified angle (30 degrees in this case). Linear guide 68 guides slider 64 in a straight line and is formed with many north and south poles arranged alternating in the direction of the straight line. When electric current flows through the coil inside slider 64 with lever engaging section 66 of slider 64 sandwiching nozzle operation lever 54 from above and below, the attraction and repulsion between the magnetic field arising in the coil and the magnets of linear guide 68 cause slider 64 to move vertically along linear guide 68. This causes nozzle operation lever 54 along with nozzle holder 46 and suction nozzle 48 to move vertically. Sub frame 38 that surrounds linear motor actuator 62 is connected to outer cover via multiple heat pipes 70. Heat pipe 70 is configured from a well-known member in which a small amount of liquid is vacuum sealed inside a pipe that has a capillary structure known as a wick on an interior wall. Here, heat pipe 70 connects a surface of outer cover 40 except for a surface facing side-view camera 80 (in the present embodiment, this is a surface facing linear motor actuator 62) to the location of linear motor actuator 62 that generates the most heat.

As shown in FIGS. 3 and 4, side-view camera 80 is provided with optical module 82 and camera main body 86. Optical module 82 is configured to guide light that enters from incident opening 84 provided in front of a component held by suction nozzle 48 to camera main body 86 provided above via a prism and mirror, which are not shown. A light emitting body, not shown, is provided on both sides of incident opening 84. The light emitting body is a light source that emits ultraviolet rays towards cylindrical reflective body 88 provided on a central lower surface of rotary head 42. Reflective body 88 emits fluorescent light when exposed to ultraviolet rays. This means that the component held by suction nozzle 48 is illuminated from behind by the fluorescent light. Camera main body 86 has a lens, an imaging element, and an image processing section, which are not shown. The lens sends light guided by optical module 82 to the imaging element. The imaging element emits an electric charge when receiving light via the lens. The image processing section receives the electric charge emitted by the imaging element and generates image data (image signal) based on the electric charge.

Operation of component mounting device 10 is described next. Described below is operation in which controller 100 mounts components on board 16 using head unit 34 based on production job data.

First, controller 100 controls X-axis slider 26 and Y-axis slider 30 to move head unit 34 such that suction nozzle 48 is above a component exposed by the film being peeled at feeder section 98. Next, controller 100 controls linear motor actuator 62 such that suction nozzle 48 is moved down to a position just short of contacting the component. Specifically, controller 100 moves slider 64 down a specified amount in a state with lever engaging section 66 of linear motor actuator 62 engaged with nozzle operation lever 54. By this, suction nozzle 48 moves down the specified amount with nozzle operation lever 54. In that state, controller 100 controls stepping motor 61 to operate valve lever 50 such that vacuum is supplied to the tip of suction nozzle 48. By this, the component is picked up at the tip of suction nozzle 48. Next, controller 100 controls linear motor actuator 62 to raise suction nozzle 48 and the held component upwards to a specified position. Next, controller 100 receives image data of the component held by suction nozzle 48 from side-view camera 80, and after having confirmed that the component is being held using pattern recognition or the like, controls R-axis motor 58 so as to rotate rotary head 42 around a center axis by a specified angle (30 degrees in this case). By this, lever engaging section 66 of linear motor actuator engages with the nozzle operation lever 54 adjacent to the previous nozzle operator lever 54. Then, controller 100, using the same procedure as above, picks up a component using suction nozzle 48 of nozzle holder 46 the lever engaging section 66 of which is engaged by the nozzle operation lever 54. Controller 100 repeats this procedure until all (twelve in this case) suction nozzles have picked up a component. Note that, in a case in which the direction of the component held by suction nozzle 48 is deviated from the correct direction, controller 100 adjusts the direction of the component to the correct direction by controlling θ-axis motor 60 to rotate nozzle holder 46.

Continuing, controller 100 controls X-axis slider 26 and Y-axis slider 30 to move head unit 34 such that the first component picked up is above a specified position on board 16. Next, controller 100 controls linear motor actuator 62 such that the component held on the tip of suction nozzle 48 is moved to a position just short of a specified position on board 16. In that state, controller 100 controls stepping motor 61 to operate valve lever 50 such that positive pressure is supplied to the tip of suction nozzle 48. By this, the component is released from the tip of suction nozzle 48 and mounted at the specified position on board 16. Next, controller 100 controls linear motor actuator 62 to raise suction nozzle 48 upwards to a specified position. Next, controller 100 receives image data of suction nozzle 48 from side-view camera 80, and after having confirmed that the component is no longer being held by suction nozzle 48 using pattern recognition or the like, controls R-axis motor 58 so as to rotate rotary head 42 around a center axis by a specified angle (30 degrees in this case). By this, lever engaging section 66 of linear motor actuator engages with the nozzle operation lever 54 adjacent to the previous nozzle operator lever 54. Then, controller 100, using the same procedure as above, mounts a component held by suction nozzle 48 of nozzle holder 46 the lever engaging section 66 of which is engaged by the nozzle operation lever 54. Controller 100 repeats this procedure until all the components held by suction nozzles 48 have been mounted on board 16.

While component mounting device 10 is operating in this manner, linear motor actuator 62 generates heat, but this heat escapes to outer cover 40 via heat pipes 70. Also, outer cover is cooled by air as head unit 34 moves in the XY direction. In particular, because outer cover 40 has multiple openings 40a in a front surface, both side surfaces, and an upper surface, air is efficiently exchanged between the inside and outside of outer cover 40 via openings 40a as head unit 34 is moved.

Correspondences between constituent elements of the present embodiment and constituent elements of the disclosure will be clarified here. Head unit 34 of the present embodiment corresponds to a component mounting device head unit of the present disclosure, rotary head 42 corresponds to a head main body, suction nozzle 48 corresponds to a nozzle, linear motor actuator 62 corresponds to a drive source, and heat pipe 70 corresponds to a heat transfer member.

According to head unit 34 of the above-described embodiment, heat generated by linear motor actuator 62 escapes via heat pipes 70 to outer cover 40 that has a relatively large surface area. By this, heat inside outer cover 40 is released efficiently.

Also, because outer cover 40 has multiple openings 40a, air is efficiently exchanged between the inside and outside of outer cover 40 via openings 40a as head unit 34 is moved in the XY direction. As a result, heat inside outer cover 40 is released efficiently.

Further, because heat pipe 70 with high thermal conductivity is used as a heat transfer member, heat inside outer cover 40 is released even more efficiently.

And, because heat pipe 70 is provided connecting a surface of outer cover 40 except for a surface facing side-view camera 80 to sub frame 38 that surrounds linear motor actuator 38, the surface of outer cover 40 that faces side-view camera 80 does not become hot easily. Thus, side-view camera 80, which is relatively easily influenced by heat, is protected from heat.

Meanwhile, it goes without saying that the disclosure is not limited to the above-mentioned embodiment and various embodiments may be applied within the technical scope of the disclosure.

For example, in the present embodiment, multiple openings 40a are provided in the front surface, both side surfaces, and the top surface, that is, four surfaces, of outer cover 40, but openings 40a may be provided in one surface, two surfaces, or three surfaces of outer cover 40. Alternatively, openings 40a do not have to be provided in any of the four surfaces. However, providing openings 40a is desirable because they improve the cooling efficiency by allowing easy exchange of air between the inside and outside of outer cover 40. The shape of an opening 40a is not limited to being a round hole, and may be any shape, such as a square hole or a long thin slit. Also, grooves (channels) or fins may be provided on outer cover 40 instead of multiple openings 40a or with multiple openings 40a. Providing grooves or fins on outer cover 40 increases the heat releasing surface area and this cools outer cover 40 efficiently. Grooves or fins, for example, may be formed along a moving direction of head unit 34.

In the above embodiment, heat pipe 70 is used as a heat transfer member, but a metal rod member may be used instead of heat pipe 70. As a metal for the metal rod member, for example, gold, silver, copper, or aluminum may be used, but considering factors such as cost and weight (relative weight), aluminum is desirable.

In the above embodiment, linear motor actuator 62 and outer cover 40 are connected by heat pipes 70 extending horizontally, but linear motor actuator 62 and outer cover 40 may be connected by a heat pipe 70 that is bent or curved. This would allow heat to escape to a section of outer cover 40 separated from linear motor actuator 62.

In the above embodiment, a synchronous linear motor is used as an example, but an induction linear motor that uses the Lorentz force that arises when a conductive body with current flowing through it is placed in a magnetic field may be used.

In the above embodiment, a linear motor actuator is given as an example of a drive source that generates heat, but other drives sources such as R-axis motor 58 that transmits moving force to rotary head 42, or e-axis motor 60 that transmits moving force to suction nozzle 48 may be connected to outer cover 40 via a heat pipe (heat transfer member). Linear motor actuator 62 may have a motor cover that surrounds slider 64 and linear guide 68, and in this case, heat pipe 70 may connect the motor cover and outer cover 40 by passing through sub frame 38.

In the above embodiment, rotary head 42 that holds twelve nozzles 48 is given as an example of a head main body, but a head that holds only one nozzle, a head that holds four suction nozzles, and so on, may be used.

In the above embodiment, heat pipe 70 connects outer cover 40 and a frame (sub frame 38) of linear motor actuator 62, but linear motor actuator 62 may be fixed to sub frame 38 via a poor-thermal-conductor member that has lower thermal conductivity than metal, such as resin or the like, and linear motor actuator 62 and heat pipe 70 (heat transfer member) may contact each other directly. In this case, outer cover 40 and linear motor actuator 62 are themselves connected by heat pipe 70.

INDUSTRIAL APPLICABILITY

The present disclosure may be applied to a component mounting device that mounts components on a board.

REFERENCE SIGNS LIST

10: component mounting device; 14: mounting device main body; 16: board; 18: board conveyance device; 20: support plate; 22: conveyor belt; 23: support pin; 26: X-axis slider 28: guide rail; 30: Y-axis slider; 32: guide rail; 34: head unit; 35: handle; 36: main frame; 38: sub frame; 40: outer cover; 40a: opening; 42: rotary head; 46: nozzle holder 48: suction nozzle; 50: valve lever; 52: R axis; 54: nozzle operation lever; 56: spring; 57: small gear; 58: R-axis motor 60: θ-axis motor 61: stepping motor; 62: linear motor actuator; 64: slider; 66: lever engaging section; 68: linear guide; 70: heat pipe; 80: side-view camera; 82: optical module; 84: incident opening; 86: camera main body; 88: reflective body; 96: reel unit; 97: reel; 98: feeder section; 100: controller

The invention claimed is:

1. A component mounting device head unit comprising:
   a head main body;
   a nozzle configured to pick up a component, the nozzle being provided on the head main body;
   a drive source configured to transfer moving power to at least one of the head main body and the nozzle;
   a cover covering the drive source;
   a heat transfer member connecting the cover to the drive source or a frame of the drive source, the heat transfer member being configured to allow heat generated by the drive source to escape to the cover; and
   a camera configured to image a component held by the nozzle, the camera being provided at a location covered by the cover,
   wherein the heat transfer member connects a surface of the cover except for a surface facing the camera to the drive source or the frame of the drive source.

2. The component mounting device head unit according to claim 1, wherein the drive source is a linear motor configured to transfer moving power to the nozzle so as to move the nozzle in a vertical direction.

3. The component mounting device head unit according to claim 1, wherein the cover includes multiple openings.

4. The component mounting device head unit according to claim 1, wherein the heat transfer member is multiple metal rod members or multiple heat pipes.

* * * * *